(12) United States Patent
Deura

(10) Patent No.: US 6,892,372 B2
(45) Date of Patent: May 10, 2005

(54) WIRING LAYOUT METHOD OF INTEGRATED CIRCUIT

(75) Inventor: Manabu Deura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 100 days.

(21) Appl. No.: 10/138,296

(22) Filed: May 6, 2002

(65) Prior Publication Data

US 2003/0028853 A1 Feb. 6, 2003

(30) Foreign Application Priority Data

Aug. 3, 2001 (JP) ....................................... 2001-235677

(51) Int. Cl.$^7$ .............................................. G06F 17/50
(52) U.S. Cl. .............................. 716/14; 716/11; 716/12; 716/13
(58) Field of Search ................................... 716/2, 7–14

(56) References Cited

U.S. PATENT DOCUMENTS

| | | | | |
|---|---|---|---|---|
| 6,373,136 B2 | * | 4/2002 | Otsuka et al. ............... | 257/758 |
| 6,505,334 B1 | * | 1/2003 | Tanaka ......................... | 716/13 |
| 6,546,540 B1 | * | 4/2003 | Igarashi et al. ............... | 716/13 |
| 6,574,782 B1 | * | 6/2003 | Dewey et al. ................ | 716/5 |
| 6,588,005 B1 | * | 7/2003 | Kobayashi et al. ........... | 716/12 |
| 2001/0011362 A1 | * | 8/2001 | Yoshinaga ..................... | 716/8 |
| 2002/0190255 A1 | * | 12/2002 | Kitahara et al. ............... | 257/69 |
| 2003/0057571 A1 | * | 3/2003 | Yamada ........................ | 257/786 |

FOREIGN PATENT DOCUMENTS

JP  5-275532  10/1993

OTHER PUBLICATIONS

Ioannis G. Tollis, A New Approach To Wiring Layhouts, IEEE, Nov. 1991, pp. 1392–1400.*
Calmidi et al., "Optimization for Thermal and Electrical Wiring For A Flip–Chip Package Using Physical–Neural Network Modeling," IEEE, Apr. 1998, pp. 111–117.*
Alpert et al., "Interconnect Synthesis Without Wiring Tapering," IEEE, Jan. 2001, pp. 90–104.*
Cong et al., "Interconnect Estimation and Planning for Deep Submicron Designs," IEEE, 1999, pp. 507–510.*

* cited by examiner

Primary Examiner—Vuthe Siek
(74) Attorney, Agent, or Firm—Staas & Halsey LLP

(57) ABSTRACT

A wiring layout method of an integrated circuit is disclosed. Checking of wiring area ratio is performed after an automatic wiring process. For a wiring other than a grid-shaped wiring, the line width W is classified into three steps of line-width range, and a minimum space width Smin between lines in each step of line-width range is defined in advance to satisfy a condition that $Wmax/(Wmax+Smin) \leq Pmax$ for a maximum line width Wmax in each step of line-width range. For grid-shaped wirings, a line width W is classified into two steps of line-width range. Further, in its upper step of line-width range, an allowable minimum area Amin ($Amin \geq Amin0$) of a metal-removed area A is defined in advance to satisfy a condition that the wiring area ratio P is less than the allowable maximum value Pmax for a maximum line width Wmax. On the other hand, in its lower step of line-width range, made is a definition that the wiring area ratio P is same as the allowable maximum value Pmax for a maximum line width Wmax. Layout of wirings whose space width or metal-removed area has been checked not to satisfy the definitions is corrected in order to satisfy them.

10 Claims, 10 Drawing Sheets

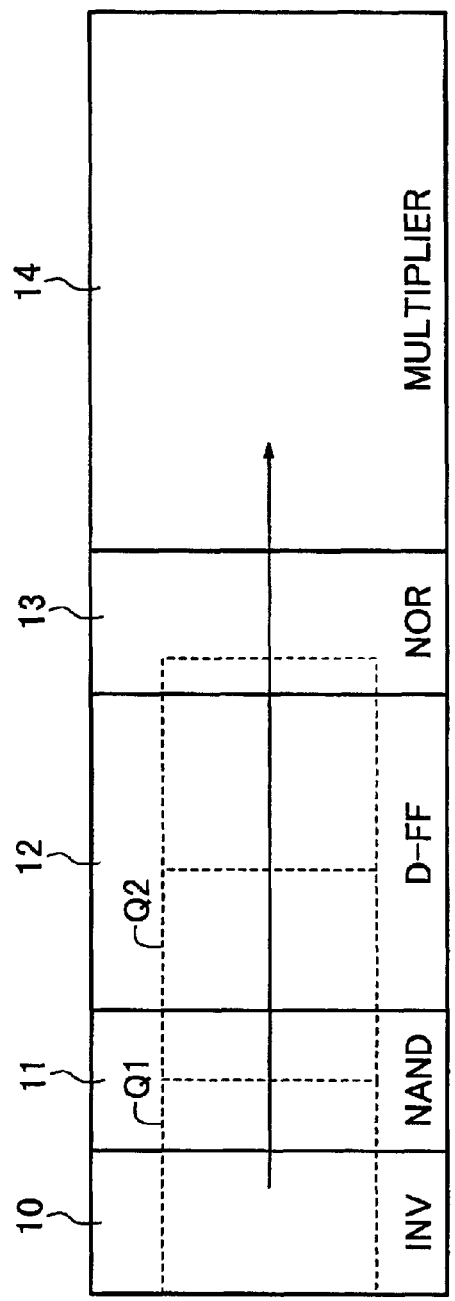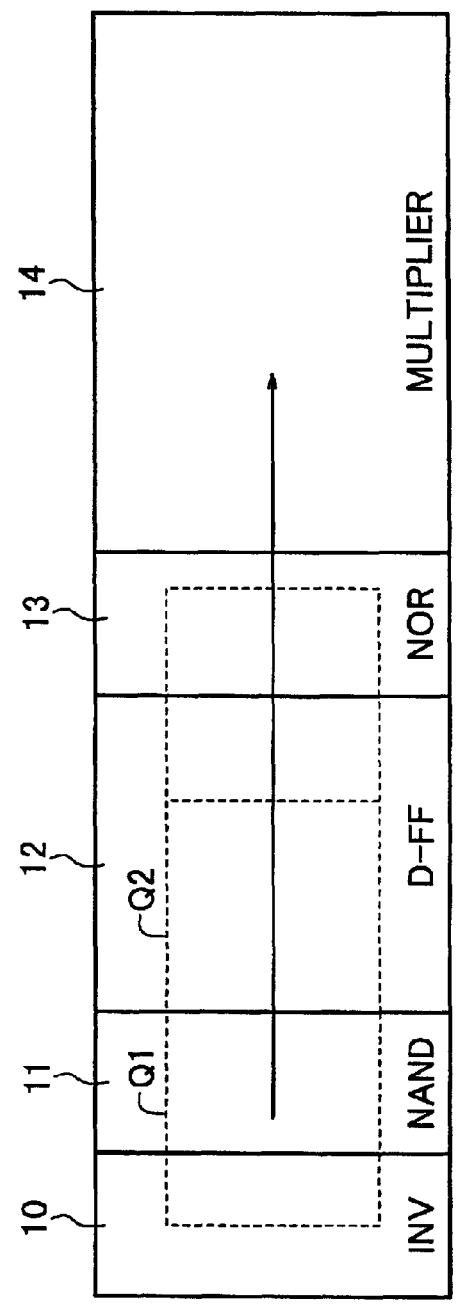
FIG.10A prior art
FIG.10B prior art

WIRING LAYOUT METHOD OF INTEGRATED CIRCUIT

BACKGROUND OF THE INVENTION

1. Field of the Invention

The present invention relates to a wiring layout method of an integrated circuit.

2. Background of the Related Art

A multilayer wiring process has been carried out for achieving a high integration density in semiconductor integrated circuits. Too much large or small value of wiring area ratio in each wiring layer causes deteriorating of the flatness of inter-layered insulator and lowering of the yield rate or reliability. Forming dummy wiring in empty areas of wiring guarantees its wiring area ratio to be higher than the allowable minimum value.

FIG. 10A shows a case where a layout design process has been carried out for an inverter 10, a NAND gate 11, a flip-flop 12, a NOR gate 13 and a multiplying circuit 14. Conventionally, after the layout design process has been finished, a checking window Q1 of, for example, 7×7 μm is set for checking whether or not the wiring area ratio is more than its allowable maximum value, and it is then shifted to the checking window Q2 in the shown arrowed-direction, repeating the same procedure.

However, when the setting location of the checking window Q1 is slightly changed to be as shown in FIG. 10B, it is occurred, for example, that an error is detected by the checking window Q2 of FIG. 10B but it is not detected by the checking window Q2 of FIG. 10A, causing a checking miss. As a result, it takes place that the flatness of inter-layered insulator gets worse, thereby lowering the reliability of semiconductor devices.

SUMMARY OF THE INVENTION

Accordingly, it is an object of the present invention to provide a wiring layout method of an integrated circuit which enables the wiring area ratio to be lower than the allowable maximum value without depending on the checking method.

In one aspect of the present invention, there is provided a wiring layout method of an integrated circuit which lays out a wiring so that a wiring area ratio P of a wiring layer is less than an allowable maximum value Pmax, the method comprising the steps of:

(a) classifying a line width W into steps of line-width range, and defining in advance a minimum space width Smin between lines in each step of line-width range so as to satisfy a condition that Wmax/(Wmax+Smin) $\leq$ Pmax for a maximum line width Wmax in each step of line-width range; and (b) laying out the wirings so as to comply with the definition of the minimum space width Smin according to the line width W.

With this aspect of the present invention, the wiring area ratio P is allowed to be lower than the allowable maximum value Pmax without depending on the checking method.

In another aspect of the present invention, there is provided a wiring layout method of an integrated circuit which, in case of laying out a grid-shaped wiring, lays out a wiring so that a wiring area ratio P of a wiring layer is less than an allowable maximum value Pmax, and a metal-removed area A of a metal-removed portion is also more than a first allowable minimum area Amin0, the method comprising the steps of:

(a) classifying a line width W into steps of line-width range, and defining in advance a second allowable minimum area Amin (Amin $\geq$ Amin0) of the metal-removed area A so as to satisfy a condition that the wiring area ratio P is less than the allowable maximum value Pmax for a maximum line width Wmax in each step of line-width range; and (b) laying out the wirings so as to comply with the definition according to the line width W of the grid-shaped wiring.

With this aspect of the present invention, conditions that P $\geq$ Pmax and A $\leq$ Amin0 are satisfied without depending on the checking method.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings;

FIGS. 10A and 10B are views for illustrating problems caused by the conventional checking method for wiring area ratio which is performed after designing a wiring layout.

DETAILED DESCRIPTION OF THE PREFERRED EMBODIMENT

A preferred embodiment of the present invention will now be described below with reference to the accompanying drawings.

Figure 4A:
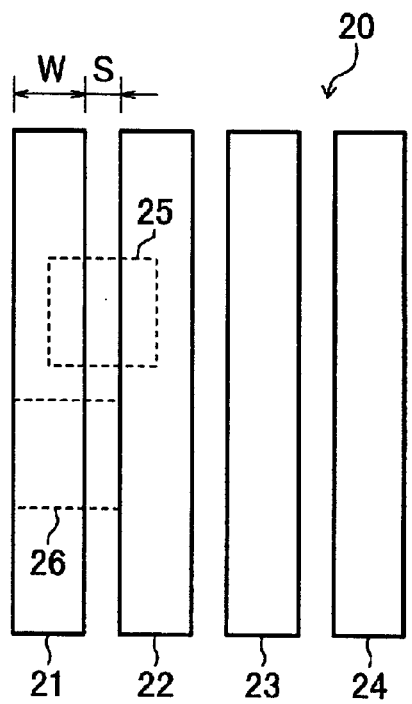
FIGS. 4A and 4B are views for illustrating wiring area ratios of a line & space and a grid-shaped wiring, respectively.
Figure 4B:
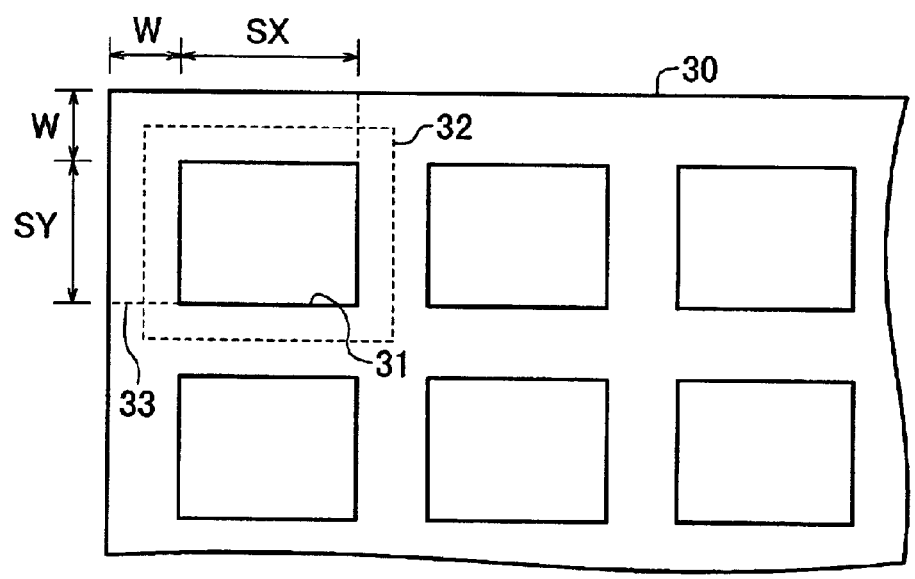

Wirings are mostly composed of line & spaces 20 as shown in FIG. 4A and grid-shaped wirings 30 as shown in FIG. 4B.

As shown in FIG. 4A, the line & space 20 has lines 21 to 24 disposed parallel to each other with a uniform pitch. There may be two lines in the line & space 20. Wiring area ratio P of the line & space 20 is same as that of a short-shaped frame 25 as shown in dotted line which has center line-segments of neighboring lines 21 and 22, and it is also same as that of a short-shaped frame 26. If we express the width of line 21 as "W" and the width of space between lines 21 and 22 as "S", P is given as follows:

$$P=W/(W+S) \quad (1)$$

The higher the wiring area ratio P is, the more it is helpful for obtaining a higher integration density. However, in order to prevent lowering of yield or reliability due to the deterioration of flatness, the following condition must be satisfied.

$$P \leq Pmax \quad (2)$$

Here, Pmax denotes the allowable maximum value, for example, 0.84.

In general, the higher the layer is positioned, the larger the width of wiring is, and the wiring width of a core portion is larger than that of input and output circuits. Let us assume that the minimum value of each of the line width W and the space width S which is allowable to be formed is "0.2≦". Let us also assume that the wiring width W of every integration circuit to be designed is in range of, for example, $0.2 \leq \leq W \leq 2.0 \leq$.

The value of space width S may be determined uniquely according to each value of line width W, but in order to prevent the processing time from being too much long, the line width W is classified into steps of line-width range and an allowable minimum value Smin is then defined in each step of line-width range in order to satisfy the condition (2). For example the line width is classified into the following steps of line-width range and each allowable minimum value Smin is defined as follows.

When 0.2μm ≦W≦1.0μm, Smin=0.2μm (3)

When 1.0μm <W≦1.6μm, Smin=0.4μm (4)

When 1.6μm <W≦2.0μm, Smin=0.5μm (5)

Figure 5A:
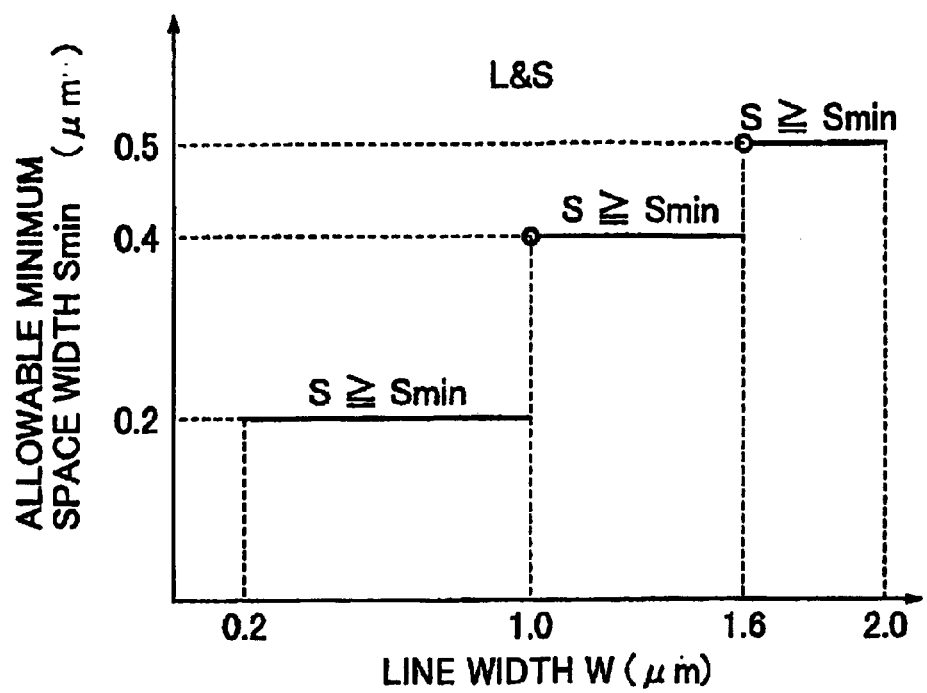
FIG. 5A is a graphical view showing a relation between a line width W and an allowable minimum space width Smin in a line & space.

"0.2≦" in rule (3) denotes the minimum value of each of the line width W and the space width S which is allowable to be formed with the current technique. FIG. 5A is a graphical view showing the relation between the line width W and the allowable minimum value Smin. When S=Smin, each range of wiring area ratio P is as follows under rules (3) to (5), respectively:

0.50≦P≦0.83

0.71<P≦0.80

0.76<P≦0.80

According to rules (3) to (5), any line width W satisfies the condition (2). Rules (3) to (5) are obtained by setting to "0.2≦" the minimum value of each of the line width W and the space width S which is allowable to be formed, thereafter setting the number of steps of line-width range to "3", and finally determining the maximum value of W using Smin of each step of line-width range and the condition (2). Alternatively, the number of steps of line-width range may be 4 and Smin may be under 0.1≦. In this case, the rules (3) and (5) are employed and the rule (4) is classified into two steps of line-width range as follows.

When, 1.0μm <W≦1.2μm, Smin=0.3μm (4-1)

When, 1.2μm <W≦1.6μm, Smin=0.4μm (4-2)

The more the number of steps of line-width range is, the longer the computer processing time is, and the number of steps of line-width range is therefore determined according to the computer processing speed. When it does no matter how long the processing time is, Smin may be determined as follows by the value of W and an integer k without classifying into steps of line-width range.

$$Smin=W/k \quad (6)$$

In this case, the following equation is obtained using the equation (1) and the equality of S≦Smin.

$$P=W/(W+S) \leq W/(W+W/k)=k/(k+1)$$

When k=4, for example, we get P≦0.8 in result of satisfying the condition (2).

Referring to FIG. 4B, a description will now be made about the limitations in the grid-shaped wiring 30.

The grid-shaped wiring 30 may be deemed to be a wiring with line-width W in grid shape. Each of widths SX and SY denotes length of neighboring sides of a metal-removed portion 31 which the grid-shaped wiring 30 has therein. Wiring area ratio P of the grid-shaped wiring 30 is same as that of a rectangular frame 32 which is, as shown in dotted line, surrounded by center lines of wiring around the metal-removed portion 31. The wiring area ratio P of the rectangular frame 32 is also same as that of its parallel moved frame 33, which is then expressed as follows:

$$P=(SX+W+SY)W/\{(W+SX)(W+SY)\} \quad (7)$$

If the area A of metal-removed portion 31 is too much small, the inter-layered insulator is deteriorated in flatness, or the dimensional accuracy degree is lowered in relation to irradiating apparatuses or etching processes. Thus, the following condition is necessary to be satisfied.

$$A \geq Amin0 \quad (8)$$

Here, Amin0 represents the allowable minimum area of the metal-removed portion 31, for example, 0.24 μm. When both the area A of the metal-removed portion 31 and the line width W are constant, the larger the difference between the widths SX and SY is, the higher the value of wiring area ratio P is. Therefore, when the width SY is a minimum value in design which is allowable to be formed by the current technique, for example, 0.2 μm and SX·SY is, for example, 0.24 μm, the line width W which yields P=0.84 is obtained as "0.6 μm" according to the equation (7). Thus, when W≦0.6 μm, the condition (2) is satisfied by setting A=Amin0=0.24.

When the area A of metal-removed portion 31 is fixed, the larger the value of line width W is, the higher the wiring area ratio P is. Therefore, we now consider a case where W=2.0 μm. As mentioned above, when both the area A of the metal-removed portion 31 and the line width W are fixed, the larger the difference between the widths SX and SY is, the higher the value of wiring area ratio P is, so that the width SX which yields P=0.84 when SY=0.5 μm is calculated to be 8 μm. Thus, if the area A of the metal-removed portion 31 is more than 4 μm in a line-width range of 0.6 μm<W≦2.0 μm, the condition (2) is satisfied.

For the reason, we now classifies the line width W of the grid-shaped wiring 30 into steps of line-width range, and define the following rules in each steps of line-width range.

When 0.6 μm≦W≦2.0 μm the allowable minimum metal-removed area Amin=4 μm (9)

When W≦0.6, the metal-removed area A is fixed to Amin0=0.24 μm (10)

Figure 5B:
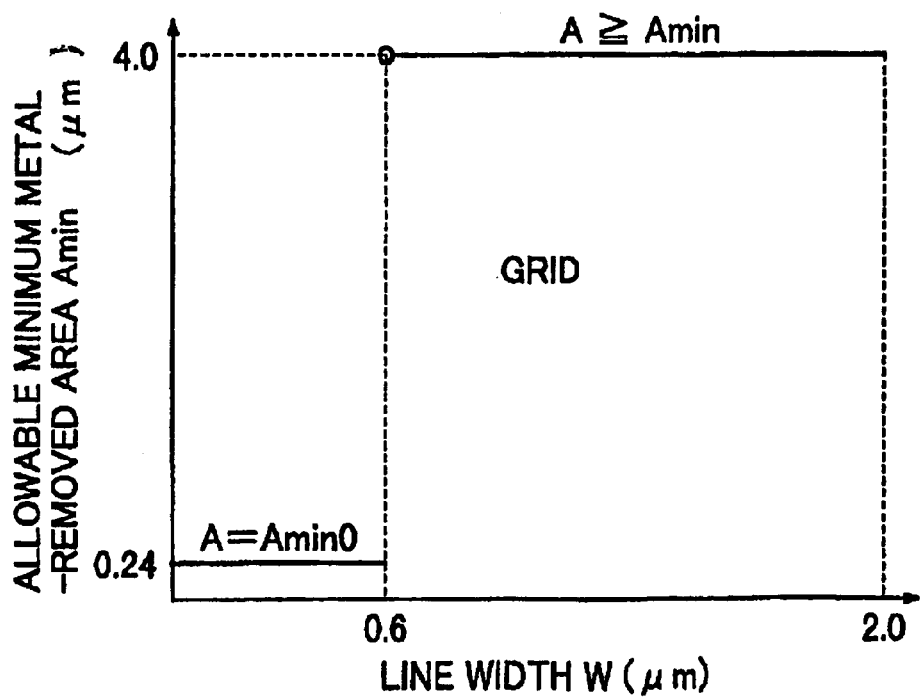
FIG. 5B is a graphical view showing a relation between a line width W and an allowable minimum metal-removed area Amin in a grid-shaped wiring.

FIG. 5B is a graphical view showing the relation between the line width W and the metal-removed area Amin. According to the rules, arbitrary values of W, SX and SY satisfy the conditions (2) and (8). The rule (9) may also be classified into further steps of line-width range, but because the more the number of steps of line-width range is, the longer the computer processing time is as mentioned above, the number of steps of line-width range is determined according to the computer processing speed.

In addition, dummy wirings are formed in empty wiring regions in pattern of line & space 20, grid-shaped wiring 30 or other patterns according to each type of empty region, and the values of W, S, SX and SY can be set to predetermined values, automatically satisfying the conditions (2) and (8).

Figure 6:
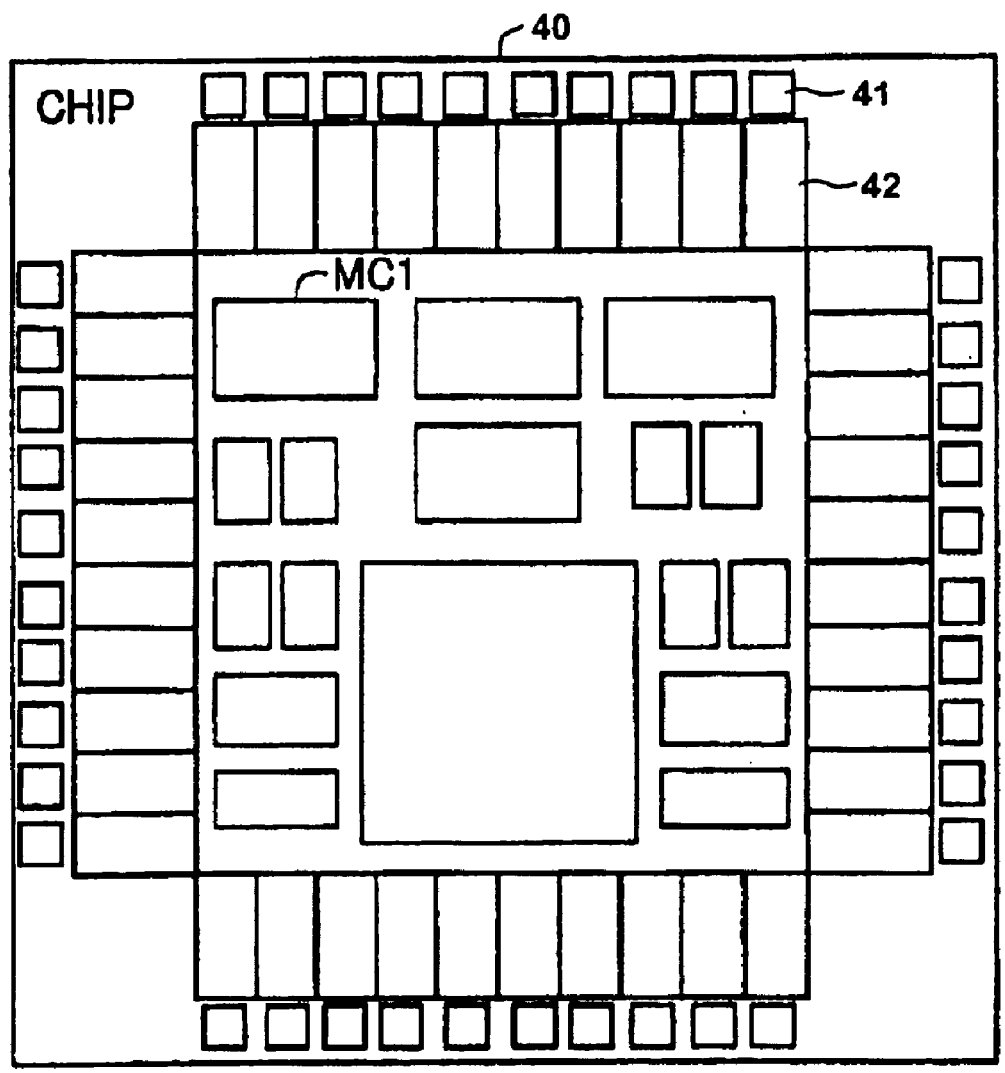
FIG. 6 is a view showing the disposition of macro cells MC1 in a chip 40 for illustrating a circuit unit as a checking object.

FIG. 6 is a view showing a plurality of macro cells MC1 which are to be disposed in a chip 40 in design process.

A plurality of pads 41 are formed in edge portion of the chip 40, I/O cells 42 are formed in correspondence with each pads 41, and the macro cell MC1s are disposed inside of I/O cells 42. Wring designing process is performed individually for each macro cell.

For simplifying the process, after automatically performing the wiring designs, a computer performs a process for checking whether or not the rules (3) to (5), (9) and (10) are satisfied, and then a process for changing the space width or the metal-removed area of error parts, which has been checked not to satisfy the rules, so as to satisfy them.

Figure 1:
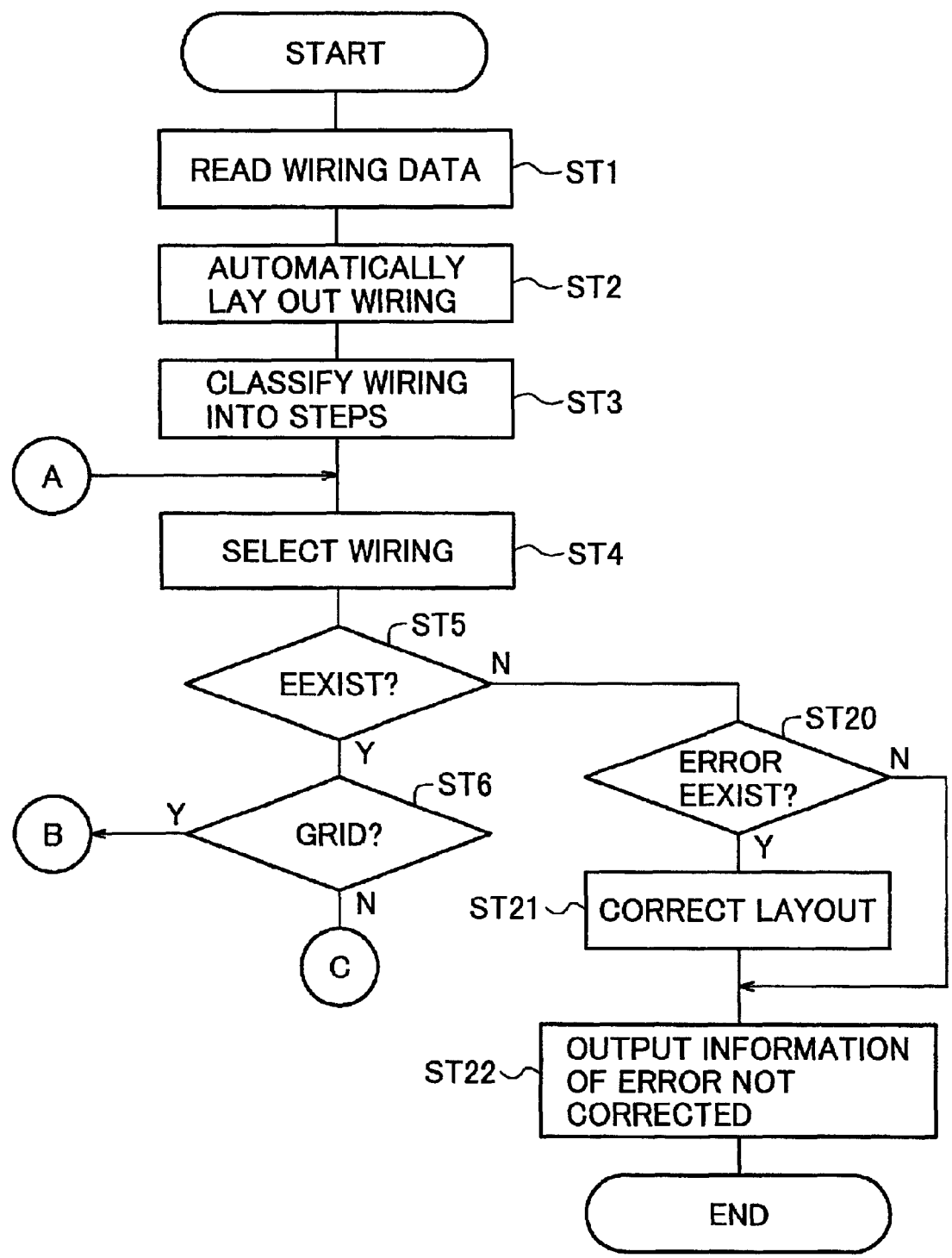
FIG. 1 is a part of flowchart schematically showing a procedure of an automatic layout design for wirings which is performed by a CAD device.
Figure 2:
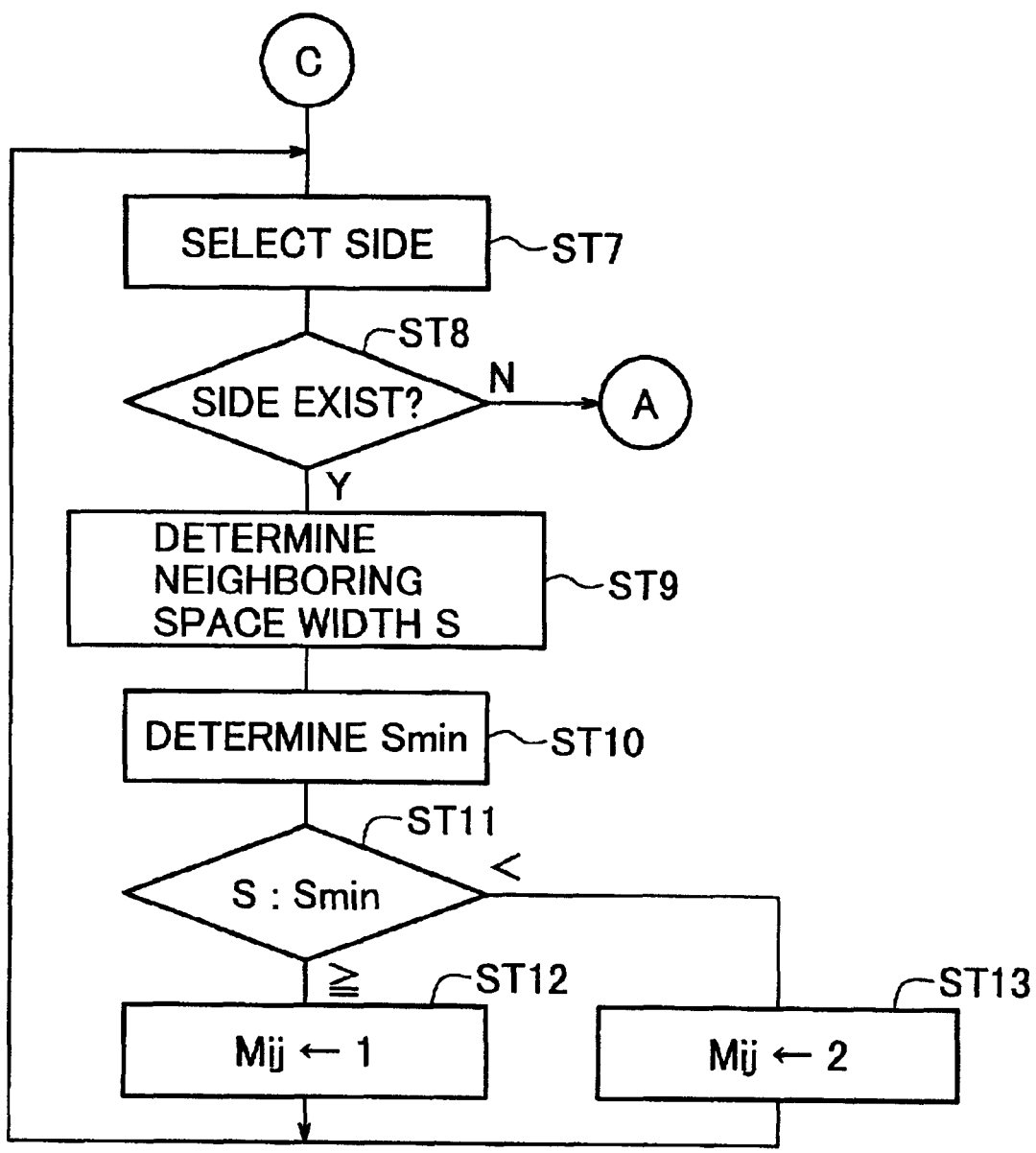
FIG. 2 is a continued flowchart of FIG. 1.
Figure 3:
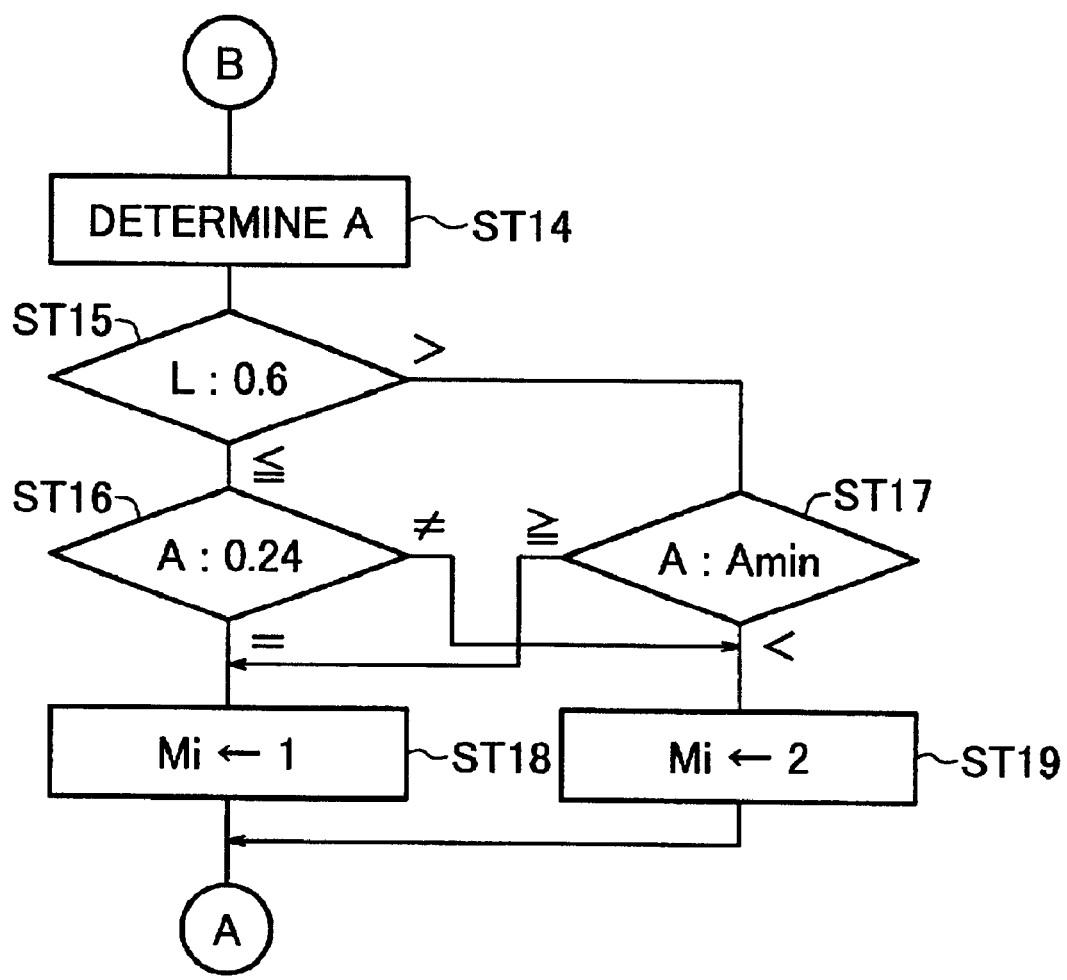
FIG. 3 is another continued flowchart of FIG. 1.

FIGS. 1 to 3 are schematic flowcharts of a wiring design process automatically performed for one macro cell by the computer. A description will be made of this process with reference to FIGS. 7 to 9.

(ST1) Data required for the automatic wiring process is read from an external memory device.

(ST2) The same automatic wiring process is executed based on this data as in the prior art.

Figure 7A:
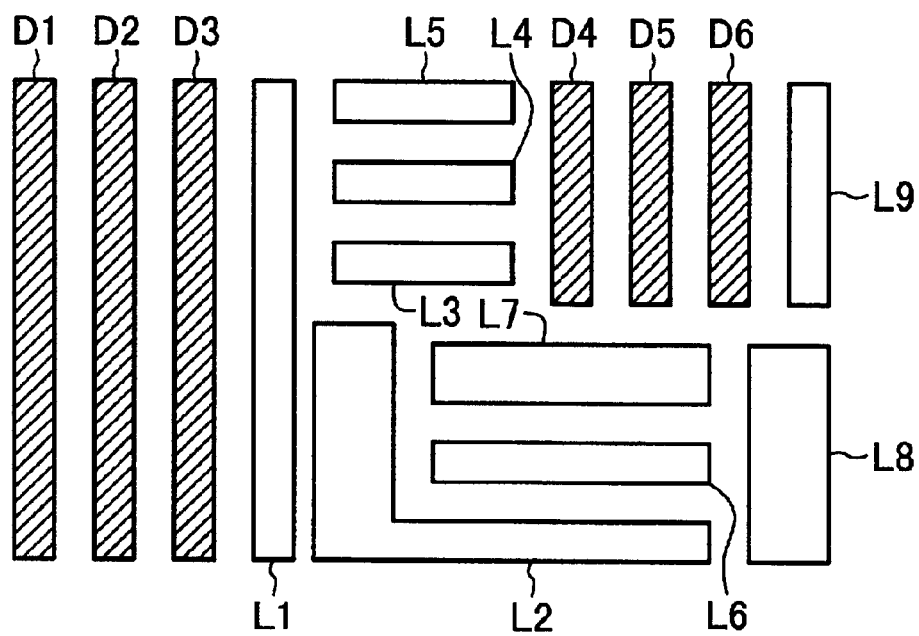
FIG. 7A is a view of wiring layout for illustrating the step ST2 shown in FIG. 1.

FIG. 7A is a view showing a portion of wiring patterns in a wiring layer which has been automatically wired. After required wirings (real wirings) are laid out, the hatched dummy wirings D1 to D6 are laid out for the empty regions.

Figure 7B:
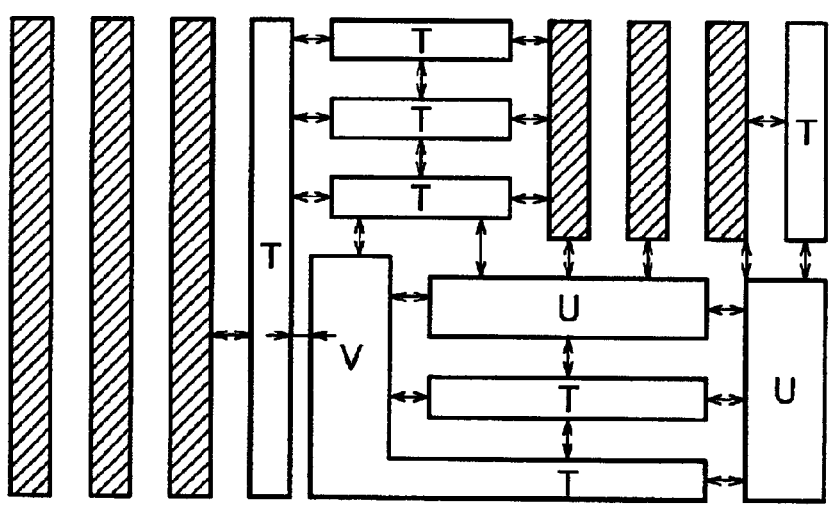
FIG. 7B is a view of wiring layout for illustrating the procedure shown in FIG. 2.

(ST3) The wiring width W is classified into steps of line-width range based on the rules (3) to (5), each for real wirings other than the grid-shaped wirings, and its step code is added to the data of the wirings. T to V shown in FIG. 7B represent the step codes added to the data of the real wirings. The relation in size of step codes T to V is given as T<U<V. In addition, let us assume that the step codes T to V correspond to the rules (3) to (5), respectively.

(ST4) As an object of checking, selection is made for one wiring which has been laid out in the step ST2 but for which the checking process has not yet been finished.

(ST5) If there is the object of checking, the processing operation is moved to a step ST6, and if not, it is moved to a step ST20.

(ST6) If the object of checking is a grid-shaped wiring, the processing operation is moved to a step ST14 shown in FIG. 3, and if not, it is moved to a step ST7 shown in FIG. 2.

When it is not a grid-shaped wiring, the following steps ST7 to ST13 are carried out for checking whether or not the space width S satisfies the rules (3) to (5) for each sides of the real wirings, as illustrated in arrowed dimensional lines in FIG. 7B.

(ST7) Selection is made for one side of the wirings which is the object of checking but for which checking process has not yet been finished.

(ST8) If there is not a side to be selected in step ST7, that is, if the checking process has been finished for all sides, the processing operation is returned to the step ST4, and if not, it is moved to a step ST9.

(ST9) A space width S between the selected side and its neighboring wiring side is obtained. For example, if selected is a side L21 of the wiring L2, obtained are the space width S1 between the side L21 and the side L61 of the wiring L6 and also the space width S2 between the side L21 and the side L71 of the wiring L7.

(ST10) Smin is obtained for a relatively larger wiring code selected from those of neighboring wirings which correspond to a space width S. The neighboring wirings may be at an angle of 90 degrees therebetween in longitudinal direction. For example, with respect to a space width S1 shown in FIG. 8A, step codes of wirings L2 and L6 are V and T, respectively, and V>T, so that "Smin=0.4 µm" of the step code V is obtained for the space width S1. In the same way, "Smin=0.4 µm" is obtained for the space width S2.

(ST11 to ST13) If S≧Smin, Mij is set to "1", and if not, it is set to "2". Here, Mij represents the checking result of the space width S between sides i and j, and has an initial value of "0". "Mij=1" represents the checking result of satisfying the rule, while "Mij=2" represents the checking result of not satisfying it, i.e., error. Thereafter, the processing operation is returned to the step ST7.

Figure 8A:
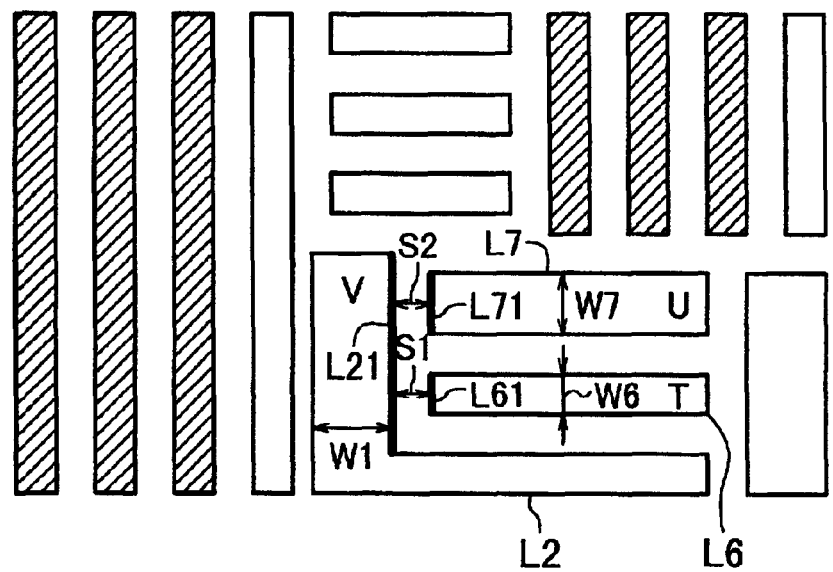
FIGS. 8A and 8B are views of wiring layout for illustrating the procedure shown in FIG. 2.
Figure 8B:
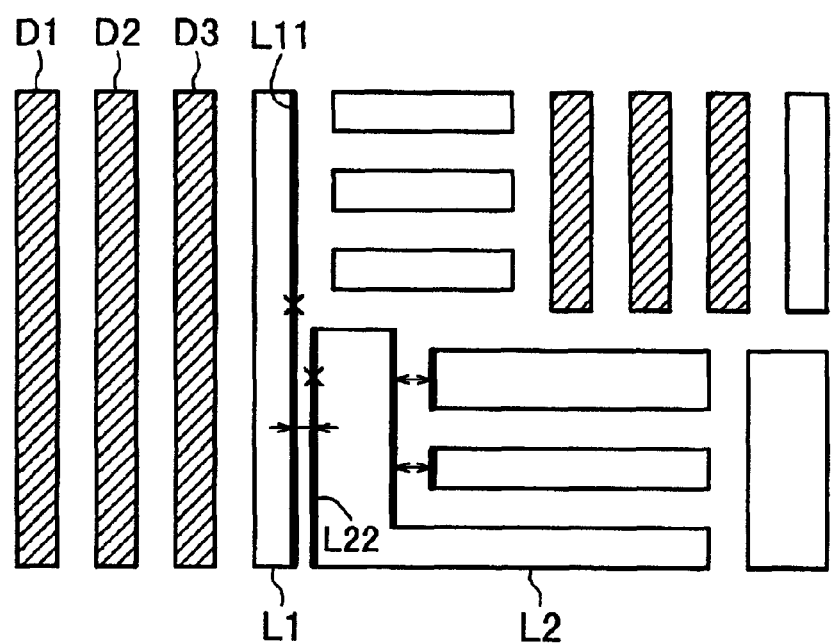

Bold lines in FIGS. 8A and 8B represent sides for which the checking process has been finished, that is, ones with Mij>0. When the wiring L7 is selected in the step ST4, the side L71 is not selected in step ST7 because it has already been checked. "X" shown in FIG. 8B denotes that Mij=2.

(ST14) The metal-removed area A is obtained.

(ST15) If W≦0.6, the processing operation is moved to a step ST16, and if not, it is moved to a step ST17.

(ST16) If A=0.24 µm, it is moved to a step ST18, and if not, it is moved to a step ST19.

(ST17) If A≦4 µm, it is moved to a step ST18, and if not, it is moved to a step ST19.

(ST18) Mi is set to "1". Here, Mi represents the checking result of wiring i, and has an initial value of "0". "Mi=1" represents the checking result of satisfying the rule, while "Mi=2" represents the checking result of not satisfying it, i.e., error. Thereafter, the processing operation is returned to the step ST4.

(ST19) After Mi is set to "2", the processing operation is returned to the step ST4.

Figure 9:
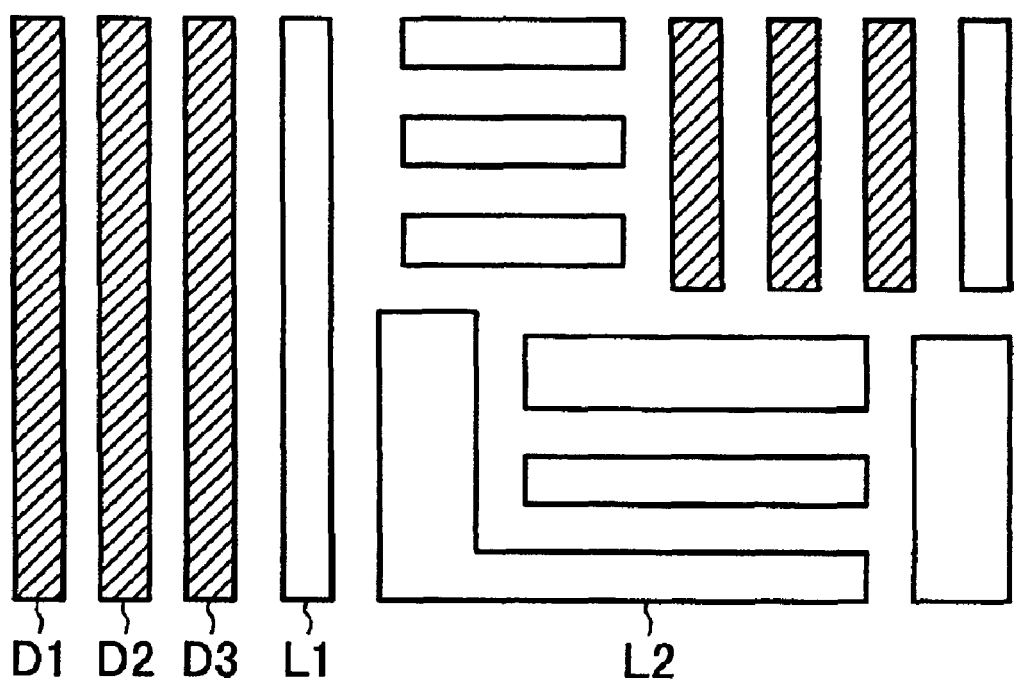
FIG. 9 is a view of wiring layout for illustrating the step ST21 shown in FIG. 1.

(ST20, ST21) If there is an error in the checking result, correction is made for layout of its wiring in order to satisfy the rule. For example, when the space width between the wirings L1 and L2 is not enough as shown in FIG. 7B, the pitches of dummy wirings D1 to D3 are shortened with the position dummy wiring D1 being fixed, and also the wiring L1 is slightly moved toward the dummy wiring D1 as shown in FIG. 9. Alternatively, a portion of the dummy wirings may be thinned out in order to secure the wiring space. When the wiring space is still not enough in spite of using the ways, the size of the macro cell is enlarged within a predetermined allowable range.

(ST22) When the error cannot be corrected in the step ST21, the error information is output. In response to this, the designer manually changes the layout to dissolve the error.

The process as mentioned above satisfies the condition (2) and (8) not depending on the checking method, thereby improving both the flatness of inter-layered insulator and the reliability of semiconductor devices.

The same process is performed for each macro cell shown in FIG. 6, and the same automatic wiring processes are also carried out between the macro cells.

In addition, the present invention may employ other various types of modifications.

As an example, the description has been made of an embodiment wherein the checking process is preformed for the wiring area ratio or the like after performing the automatic wiring process, but the present invention may have a modification wherein the automatic wiring process is performed so as to satisfy the rules.

Further, the automatic wiring process was carried out individually for each macro cell in the embodiment described above, but it may be collectively performed for the entire chip.

Furthermore, instead of correcting the automatic layout in the step ST21, the layout may be manually modified after outputting the error information in the step ST22.

Also, being irrespective of what type of the wiring forming method, the present invention may be applied to wirings formed by the conventional dry etching method as well as Damascene wiring employing Cu and Al or the like The forgoing embodiments are merely exemplary and are not to be construed as limiting the present invention. The present teachings can be readily applied to other types of methods or apparatuses. The description of the present invention is intended to be illustrative, and not to limit the scope of the claims. Many alternatives, modifications, and variations will be apparent to those skilled in the art.

What is claimed is:

1. A wiring layout method of an integrated circuit which lays out a wiring so that a wiring area ratio P of a wiring layer is less than an allowable maximum value Pmax, the method comprising the steps of:
   (a) classifying a line width W into steps of line-width range, and defining in advance a minimum space width Smin between lines in each step of line-width range so as to satisfy a condition that Wmax/(Wmax+Smin) $\leq$ Pmax for a maximum line width Wmax in each step of line-width range; and
   (b) laying out the wirings so as to comply with the definition of the minimum space width Smin according to the line width W.

2. The method according to claim 1, wherein the minimum space width Smin in step (a) is defined so that the value of Wmax/(Wmax+Smin) is substantially the same as that of Pmax.

3. The wiring layout method of an integrated circuit which, in case of laying out a grid-shaped wiring, lays out a wiring so that a wiring area ratio P of a wiring layer is less than an allowable maximum value Pmax, and a metal-removed area A of a metal-removed portion is also more than a first allowable minimum area Amin0, the method comprising the steps of:
   (a) classifying line width W into steps of line-width range, and defining in advance a second allowable minimum area Amin (Amin$\geq$Amin0) of the metal-removed area A so as to satisfy a condition that the wiring area ratio P is less than the allowable maximum value Pmax for a maximum line width Wmax in each step of line-width range; and
   (b) laying out the wirings so as to comply with the definition according to the line width W of the grid-shaped wiring.

4. The method according to claim 3, wherein the second allowable minimum area Amin in the step (a) is defined so that the wiring area ratio P is substantially the same as that of Pmax for a maximum line width Wmax in each step of line-width range in case where the metal-removed portion is in a shape enabling the wiring area ratio P to become maximum.

5. The method according to claim 4, wherein the steps of line-width range in the step (a) include two steps of W1min$\leq$W$\leq$W1max and W$\leq$W1min.

6. The method according to one of claims 3 through 5, wherein in step (a), the metal-removed area A in a minimum step of line-width range is defined to be the same as the first allowable minimum area Amin0.

7. A wiring layout method of an integrated circuit which, in case of laying out a grid-shaped wiring, lays out a wiring so that a wiring area ratio P of a wiring layer is less than an allowable maximum value Pmax, and so that a metal-removed area A of a metal-removed portion is also more than a first allowable minimum area Amin0, the method comprising the steps of:
   (a1) classifying its line width W into steps of line-width range for a line & space, and defining in advance a minimum space width space between lines in each steps of line-width range so as to satisfy a condition that Wmax/(Wmax+Smin)$\leq$Pmax for a maximum line width Wmax in each step of line-width range;
   (a2) classifying its line width W into steps of line-width range for the grid-shaped wiring, and defining in advance a second allowable minimum area Amin (Amin$\geq$Amin0) of the metal-removed area A so as to satisfy a condition that the wiring area ratio P is less than the allowable maximum value Pmax or a maximum line width Wmax in each step of line-width range; and
   (b) laying out the wirings so as to comply with the definitions according to the line widths W.

8. The method according to claim 7, wherein the minimum space width Smin in step (a1) is defined so that the value of Wmax/(Wmax+Smin) is substantially the same as that of Pmax.

9. The method according to claim 8, wherein the second allowable minimum area Amin in the step (a2) is defined so that the wiring area ratio P is less than and also substantially the same as that of Pmax for a maximum line width Wmax in each step of line-width range in case where the metal-removed portion is in a shape enabling the wiring area ratio P to become maximum.

10. The method according to claim 9, wherein in step (a2) the metal-removed area A in a minimum step of line-width range is defined to be the same as the first allowable minimum area Amin0.

* * * * *

UNITED STATES PATENT AND TRADEMARK OFFICE
CERTIFICATE OF CORRECTION

PATENT NO. : 6,892,372 B2  Page 1 of 1
APPLICATION NO. : 10/138296
DATED : May 10, 2005
INVENTOR(S) : Manabu Deura It is certified that error appears in the above-identified patent and that said Letters Patent is hereby corrected as shown below:

Title Page,   [56] OTHER PUBLICATIONS
change "Ioannis G. Tollis, A New Approach To Wiring Layhouts, IEEE, Nov. 1991, pp. 1392-1400." to --Ioannis G. Tollis, "A New Approach to Wiring Layouts, IEEE, Nov. 1991, pp. 1392-1460.--.

Column 7,   line 49, (claim 3, line 8) after "classifiying" insert --a--.

Column 8,   line 26, (claim 7, line 10) delete "space" (second occurrence) and insert --Smin--;
line 36, (claim 7, line 19) change "or" to --for--.

Signed and Sealed this

Fifth Day of December, 2006

JON W. DUDAS
*Director of the United States Patent and Trademark Office*